United States Patent [19]

Yoshida et al.

[11] Patent Number: 5,641,605
[45] Date of Patent: Jun. 24, 1997

[54] LITHOGRAPHIC PRINTING PLATE

[75] Inventors: Akio Yoshida; Hideaki Baba; Motozo Yamano, all of Tokyo, Japan

[73] Assignee: Mitsubishi Paper Mills Limited, Tokyo, Japan

[21] Appl. No.: 554,627

[22] Filed: Nov. 6, 1995

[30] Foreign Application Priority Data

Nov. 7, 1994 [JP] Japan .................. 6-272491
Nov. 11, 1994 [JP] Japan .................. 6-278061
Dec. 27, 1994 [JP] Japan .................. 6-325966
Mar. 29, 1995 [JP] Japan .................. 7-071608

[51] Int. Cl.$^6$ .................. G03C 8/06; G03C 8/28; G03C 8/44; G03F 7/07
[52] U.S. Cl. .................. 430/207; 430/204; 430/227; 430/229; 430/950
[58] Field of Search .................. 430/204, 207, 430/227, 229, 950

[56] References Cited

U.S. PATENT DOCUMENTS 5,281,509 1/1994 Murakata et al. .................. 430/204
5,445,915 8/1995 Vaes .................. 430/204

FOREIGN PATENT DOCUMENTS 0 567 178 A1 10/1993 European Pat. Off. .

*Primary Examiner*—Richard L. Schilling
*Attorney, Agent, or Firm*—Cushman Darby & Cushman IP Group of Pillsbury Madison & Sutro LLP

[57] ABSTRACT

Disclosed is a lithographic printing plate excellent in scratch resistance, stain resistance, print image quality and ink-removability. The lithographic printing plate comprises a support and, coated thereon in succession, at least one undercoat layer, a silver halide emulsion layer and a physical development nuclei layer, characterized in that the lithographic printing plate has an arithmetical mean deviation of the profile Ra of 0.6 or less and the layers on the silver halide emulsion layer-provided side of the support contain 2.0 g/m$^2$ or more of a matting agent.

11 Claims, No Drawings

LITHOGRAPHIC PRINTING PLATE

BACKGROUND OF THE INVENTION

The present invention relates to a lithographic printing plate to be processed utilizing silver complex diffusion transfer process, and a method for making the lithographic printing plate.

A lithographic printing plate after processed comprises oleophilic image portions which are receptive to oily inks and oil-repellent non-image portions which are not receptive to the inks. In general, said non-image portions are receptive to water, namely, hydrophilic. Usual lithographic printing is carried out by feeding both water and ink to the surface of printing plates to allow the image portions to receive preferentially the ink and the non-image portions to receive preferentially water and then, transferring the ink on the image portions onto a substrate such as paper. Therefore, in order to obtain good prints, it is necessary that the difference between oleophilicity of the image portions and hydrophilicity of the non-image portions is sufficiently great so that when water and ink are fed to the surface of the plate the image portions can receive sufficient amount of ink while the non-image portions do not utterly receive the ink.

Lithographic printing plates processed utilizing silver complex diffusion transfer process, especially those which have a physical development nuclei layer on a silver halide emulsion layer are described, for example, in U.S. Pat. Nos. 3,728,114, 4,134,769, 4,160,670, 4,336,321, 4,501,811, 4,510,228, and 4,621,041. The exposed silver halide crystal is chemically developed by the DTR development and converted to black silver to form hydrophilic non-image portions, and, on the other hand, unexposed silver halide crystal is converted to a silver salt complex with silver salt complexing agent contained in the developer, and the complex diffuses toward the surface physical development nuclei layer and is physically developed in the presence of the nuclei to form image portions mainly composed of an ink receptive physical development silver.

The influence of the surface unevenness of lithographic printing plates exerted on printability is known in the field of presensitized plate, and this is also important in lithographic printing plates processed utilizing silver complex diffusion transfer process. Especially, in the lithographic printing plates processed utilizing silver complex diffusion transfer process, the non-image portion is mainly composed of a gelatin film, and though this is inherently high in hydrophilicity, the lithographic printing plates have generally been designed to have a highly mat surface (highly uneven surface) with a matting agent used for improving printing endurance of the image portion. U.S. Pat. No. 5,281,509 discloses that there is a correlation between the surface mat property and the printing stain and that the printing stain of non-image portions can be considerably diminished by smoothening the surface.

However, although smoothening of the surface had the effect to improve the printing stain, scratches were apt to occur on the surface of printing plate by the processing with automatic processor during developing treatment at the time of plate making. This phenomenon readily occurs especially when a polyester film is used as a support, and the scratches are doubled on the image portions to cause serious defects in practical use.

Furthermore, due to the recent diversification of automatic processors, the printing plates are subjected to more harsh usage than in conventional use, and the scratch more readily occurs. Moreover, demand for higher image quality and more minute printing increases, and the similar demand is also made for the lithographic printing plates processed utilizing silver complex diffusion transfer process. Particularly, it is important for the improvement of print image quality of the lithographic printing plates to diminish the surface roughness, and, therefore, smoothening of the surface becomes essential. Accordingly, there are desired lithographic printing plates processed utilizing silver complex diffusion transfer process which have a scratch resistance enough to stand the processing under the practically necessary processing conditions and can give excellent print image quality.

On the other hand, responsiveness to ink/water is important for printing, and the higher responsiveness is preferred in setting proper printing conditions by changing feeding amount of ink or water. Especially, if stains occur during printing, the number of damaged papers increases with increase in the time required for erasion of the ink stains by changing the feeding amount of water. Therefore, reduction of the time required for erasion of stains has been desired.

Japanese Patent Kokai No. 5-100430 discloses that ink removability is improved by limiting the amount of gelatin in the undercoat layer, but this is not sufficient for maintaining or improvement of stain resistance which is an important condition for lithographic printing plates. That is, maintenance of stain resistance with improvement of ink removing rate is an important condition for lithographic printing plates, and this has been demanded. Accordingly, as a result of intensive research conducted by the inventors on the relation between ink removability and water absorption in the layers on the emulsion layer-provided side of the support, it has been found that by specifying the surface roughness and the amount of absorbed water, the ink removing rate can be remarkably improved without causing reduction in stain resistance.

Furthermore, as the supports of lithographic printing plates to which silver complex diffusion transfer process is applied, polyolefin-laminated paper bases (hereinafter referred to as "resin-coated papers"), subbed polyethylene terephthalate films, aluminum sheets, etc. are used. The resin-coated papers are advantageous in cost and environmental protection, and there is a great demand for lithographic printing plates using resin-coated papers as the support. Conventionally, resin-coated papers the surface of which is roughened have been used as described in Japanese Patent Kokoku No. 55-19756, but the print image quality is unsatisfactory and improvement of the image quality has been strongly demanded.

SUMMARY OF THE INVENTION

The object of the present invention is to provide a lithographic printing plate processed utilizing the silver complex diffusion transfer process which is excellent in scratch resistance, stain resistance, print image quality, and ink removability.

The above object has been fundamentally attained by a lithographic printing plate comprising a support and, coated thereon in succession, at least one undercoat layer, a silver halide emulsion layer and a physical development nuclei layer, characterized in that arithmetical mean deviation of the profile Ra (namely, average roughness value) of the lithographic printing plate is 0.6 or less and amount of a matting agent contained in the layers provided on the silver halide emulsion layer-provided side of the support is 2.0 $g/m^2$ or more.

Furthermore, a preferred embodiment of the present invention is obtained by a lithographic printing plate having the construction as explained in detail hereinafter.

DESCRIPTION OF THE INVENTION

U.S. Pat. No. 5,281,509 discloses lithographic printing plates having an arithmetical mean deviation of the profile of 1.2 or less and containing 0.1–2.0 g/m² of a matting agent having a particle size of 5 μm or less, but these lithographic printing plates do not simultaneously satisfy the scratch resistance, stain resistance and print image quality which are aimed at by the present invention. Accordingly, as a result of intensive research, the inventors have found that the print image quality and the scratch resistance can be effectively improved without causing deterioration of stain resistance by densely filling a matting agent having a small average particle size in photographic constituting layers of lithographic printing plate and by maintaining the arithmetical mean deviation of the profile, Ra value, of lithographic printing plate at a lower level.

In the present invention, as described in U.S. Pat. No. 5,281,509, the arithmetical mean deviation of the profile Ra of the lithographic printing plate can be measured using a surface roughness and profile measuring machine, for example, SURFCOM 500B manufactured by Tokyo Seimitsu Co., Ltd. When the portion of sampling length l to be measured in the direction of arithmetical mean line (center line) is extracted from profile curve and when the center line of the extracted portion is assumed to be x axis and the vertical direction is assumed to be y axis, and the profile curve is shown by y=f(x), the arithmetical mean deviation of the profile, Ra, which is expressed by micrometer unit can be calculated by the following formula.

$$Ra = \frac{1}{l} \int_{o}^{l} |f(x)| dx$$

In the present invention, it is necessary that the arithmetical mean deviation of the profile Ra of the lithographic printing plate is 0.6 or less. When Ra is more than 0.6, the print image quality deteriorates.

The lithographic printing plate of the present invention contains 2.0 g/m² or more of a matting agent in the constituting layers on the silver halide emulsion layer-provided side of the support. The amount of the matting agent is preferably 2.0–5.0 g/m², more preferably 2.2–3.5 g/m². When the amount is less than 2.0 g/m², printing endurance and scratch resistance deteriorate.

The matting agent used in the present invention is preferably a solid powder of 3 μm or less in average particle size, and the average particle size is more preferably 0.3–2 μm. The matting agent includes, for example, silica particles and organic particles such as styrene. Especially preferred are silica particles having an oil absorption of 150 or less disclosed in Japanese Patent Kokai No. 7-168360. The oil absorption can be measured by the test method specified in JIS K5101. Examples of such silica particles are CARPLEX, e.g., FPS-101 (average particle size: 1.1 μm, oil absorption: 130 ml/100 g) manufactured by Shionogi & Co., Ltd. These matting agents are excellent in aqueous dispersibility and are used preferably in the present invention.

In the present invention, the matting agent may be contained in any of the constituting layers provided on the silver halide emulsion layer-provided side of the support, but preferably in the silver halide emulsion layer and/or the undercoat layer between the support and the silver halide emulsion layer. Preferably, at least 90% by weight of the total matting agent on the silver halide emulsion layer-provided side of the support is contained in the undercoat layer. More preferably, 2.0 g/m² or more of the matting agent is contained in the undercoat layer. In this case, the silver halide emulsion layer may not contain the matting agent or may contain it in an amount of about 0.1–about 1 g/m².

As mentioned above, the present invention is based on the technical idea of densely filling the matting agent in the constituting layers, and, in this sense, particularly, the weight ratio of the matting agent to gelatin in the undercoat layer is preferably 0.8 or higher, more preferably 1.0 or higher.

The binder used in the present invention may be replaced with at least one of hydrophilic polymers such as gelatin, water-soluble gelatin, starch, dextrin, albumin, sodium alginate, hydroxyethyl cellulose, gum arabic, polyvinyl alcohol, polyvinyl pyrrolidone, carboxymethyl cellulose, polyacrylamide, styrene-maleic anhydride copolymer, polyvinylmethyl ether-maleic anhydride copolymer, etc. Furthermore, vinyl polymer aqueous dispersion (latexes such as styrene-butadiene copolymer) may be used. Among them, preferred are gelatin or combinations of gelatin with other binders enumerated above.

In the present invention, the total amount of the binder on the silver halide emulsion layer-provided side of the support is preferably 8.0 g/m² or less, more preferably 1–6 g/m². Especially, the gelatin content is preferably 1–5 g/m². As mentioned hereinafter, since the gelatin content affects water absorption of lithographic printing plates, it is preferably reduced, taking into consideration the ink removability. The gelatin content in the undercoat layer is preferably 1–5 g/m², more preferably 1–4 g/m².

The mechanism of the present invention can be presumed as follows. As a result of reducing the arithmetical mean deviation of the profile Ra in order to improve stain resistance and print image quality, scratches are apt to occur at the step of development processing, especially at the time of processing by an automatic processor for plate making. The reason is considered that when the lithographic printing plate carried during development processing contacts with a guiding plate in the automatic processor, the function to scatter the force applied to the surface of the printing plate decreases with increase in smoothness of the printing plate. The reason why the tendency is conspicuous when a polyester film support is used seems that since the hardness of the support is relatively high, the function to scatter the force applied to the surface, namely, the stress relaxation function further decreases to result in occurrence of scratches. It has been found that densely filling a minute matting agent in the constituting layers on the silver halide emulsion layer-provided side of the support, especially in the undercoat layer for improving the stress relaxation characteristic and maintaining the smoothness of the surface roughness is effective for improving scratch resistance, stain resistance and print image quality.

Furthermore, the inventors have noticed the relation between water absorption on the silver halide emulsion layer-provided side of the support and ink removability, and have found that the ink removing rate can be remarkably improved without causing deterioration of stain resistance by specifying the surface roughness and the water absorption. That is, by specifying the water absorption on the silver halide emulsion layer-provided side of the support to 5 g/m² or less, the ink removing rate can be remarkably improved. The term "ink removing rate" used here means a time required from applying an ink to the whole surface of a lithographic printing plate in the absence of dampening water until the ink is removed from the non-image portions of the surface by beginning the feeding of the dampening water.

In the present invention, the water absorption of lithographic printing plate is obtained in the following manner. The emulsion layer-provided side of a lithographic printing plate before processed to form images thereon (lithographic printing plate precursor) (excluding back coat layer) is dipped in water (20° C.) for 1 minute, and, then, water remaining on the surface is removed by a filter paper or the like. Difference in the weight of the lithographic printing plate before and after dipped in water is the water absorption of lithographic printing plate.

In the present invention, it is preferred that at least 90% by weight of particles of a matting agent having an average particle size of 0.3–2.0 μm are contained in the state of dispersion in single particle form in the constituting layers on the silver halide emulsion layer-provided side of the lithographic printing plate. When a section of the lithographic printing plate of the present invention is observed by an electron microscope, it is observed that at least 90% by weight of the matting agent is dispersed in the form of single particles. By dispersing the matting agent in the form of single particles, the surface can be made further smoother and the print image quality can be further improved.

In the present invention, it is preferred that the dispersion of the matting agent is contained in an amount of 0.8 or more per 1 of gelatin in at least one of a coating solution for the undercoat layer and/or a coating solution for the emulsion layer.

In the present invention, in order to produce the state of at least 90% by weight of particles of the matting agent having an average particle size of 0.3–2.0 μm being dispersed in the form of single particles, there may be preferably employed, for example, a method of treating by ultrasonic dispersing device.

Titanium oxides can be used in the constituting layers on the silver halide layer-provided side of the lithographic printing plate of the present invention. The titanium oxides used may be of any forms such as anatase type, rutile type, etc. They are preferably surface treated for the purpose of stabilization of dispersibility. The titanium oxide is usually dispersed in water and added to the coating solution at the time of making up of the solution before coating, but this is not limitative. Amount of the titanium oxide added may vary depending on various conditions, but generally is in the range of 1–20 g/m².

The lithographic printing plate according to the present invention contains gelatin, and the gelatin may be contained in any of undercoat layer, emulsion layer or physical development nuclei layer. These layers containing gelatin can be hardened by gelatin hardeners. The gelatin hardeners include, for example, inorganic compounds such as chrome alum; aldehydes such as formalin, glyoxal, malealdehyde and glutaraldehyde; N-methylol compounds such as urea and ethyleneurea; aldehydes such as mucochloric acid and 2,3-dihydroxy-1,4-dioxane; compounds having active halogen such as 2,4-dichloro-6-hydroxy-S-triazine salts and 2,4-dihydroxy-6-chloro-S-triazine salts; divinyl sulfones, divinyl ketones, N,N,N-triacryloylhexahydrotriazine, compounds having in the molecule two or more ethyleneimino group or epoxy group which is an active 3-membered ring, and dialdehyde starch as a polymer hardener. These compounds may be used each alone or in combination of two or more.

The hardeners can be added to all or some of the layers or only one of the layers. Of course, a diffusible hardener can be added to only one of the two layers which are simultaneously coated. The hardeners can be added at the time of preparation of emulsion or can be added in in-line manner at the time of coating of layers.

The undercoat layer can contain pigments and dyes such as carbon black for the purpose of antihalation. It may further contain photographic additives such as developing agents. Moreover, the undercoat layer may be such as described in Japanese Patent Kokai Nos. 48-5503, 48-100203 and 49-16507.

The silver halide emulsion layer comprises, for example, silver chloride, silver bromide or silver chlorobromide or these silver halides which further contain silver iodide. The silver halide crystal may contain heavy metal salts such as rhodium salts, iridium salts, palladium salts, ruthenium salts, nickel salts, and platinum salts. Amount of the salts added is preferably $10^{-8}$–$10^{-3}$ mol per 1 mol of silver halide. The crystal form of the silver halide is unlimited, and the crystal grains may be cube, fourteenfaced polyhedron, core-shell type, platy grains, etc. The silver halide crystal may be monodispersed or polydispersed ones. The average grain size is 0.2–0.8 μm. One of preferred examples is a monodispersed or polydispersed crystal containing a rhodium salt or an iridium salt and at least 80 mol% of silver chloride.

The silver halide emulsion can be sensitized in various ways during its preparation or coating. The emulsion is preferably sensitized chemically by the methods well known to the art by using, for example, sodium thiosulfate, alkylthioureas, or gold compounds such as gold rhodanide and gold chloride or a mixture thereof. The silver halide emulsion may also be sensitized or desensitized positively or negatively, for example, with dyes such as cyanine dyes and merocyanine dyes. The wavelength region to which the emulsion can be sensitized or desensitized has no special limitation. The emulsion can be subjected to orthochromatic sensitization, panchromatic sensitization, helium-neon laser sensitization, argon laser sensitization, LED sensitization, semiconductor laser sensitization or UV sensitization for roomlight processing, and visible light desensitization.

The surface layer provided above the emulsion layer contains physical development nuclei. The physical development nuclei may be metallic colloid fine particles such as silver, antimony, bismuth, cadmium, cobalt, lead, nickel, palladium, rhodium, gold, and platinum, sulfides, polysulfides, selenides of these metals or mixtures or mixed crystals of them. The physical development nuclei may or may not contain hydrophilic binders, but may contain hydrophilic polymers such as gelatin, starch, dialdehyde starch, carboxymethyl cellulose, gum arabic, sodium alginate, hydroxyethyl cellulose, polystyrenesulfonic acid, sodium polyacrylate, a copolymer of vinylimidazole and acrylamide, copolymer of acrylic acid and acrylamide, and polyvinyl alcohol or oligomers thereof. Content of the binder is preferably 0.5 g/m² or less. Furthermore, the physical development nuclei layer may contain developing agents such as hydroquinone, methylhydroquinone and catechol, and known hardeners such as formalin and dichloro-s-triazine.

The respective coating layers such as undercoat layer, silver halide emulsion layer, physical development nuclei layer, etc. may contain some of anionic, cationic or neutral surface active agents as coating aids, and furthermore, antifoggants, matting agents, thickeners and antistatic agents.

The supports used for lithographic printing plates of the present invention may be resin-coated papers coated with polyolefin resins on one or both sides, polyester films, polyester films the surface of which is subjected to hydrophilizing treatment, surface-treated aluminum sheets, etc. These supports may contain pigments for antihalation and solid fine particles for improvement of surface properties. Moreover, the supports may be light transmissive so that the lithographic printing plate can be exposed from backside. Polyester films and resin-coated papers are especially preferred.

The lithographic printing plates of the present invention are superior to conventional ones in scratch resistance, stain resistance, print quality and ink-removability, and lithographic printing plates made using a polyester film as the support are conspicuously improved especially in scratch resistance and stain resistance, and lithographic printing plates made using resin-coated paper are conspicuously improved especially in print quality and stain resistance.

The resin-coated papers used in the present invention are paper supports laminated with polyolefin resins. The polyolefins are polyethylene, polypropylene, etc., and low-density polyethylenes, high-density polyethylenes or mixtures thereof are often used. The surface of the supports can be surface treated to improve adhesion to the coating layers. The arithmetical mean deviation of the profile Ra of the polyolefin-laminated paper used in the present invention is preferably 0.5 or less.

The development processing solution used in the present invention can contain alkaline substances such as sodium hydroxide, potassium hydroxide, lithium hydroxide and sodium tertiary phosphate, preservatives such as sulfites, silver halide solvents such as thiosulfates, thiocyanates, cyclic imides, 2-mercaptobenzoic acid and amines, thickeners such as hydroxyethyl cellulose and carboxymethyl cellulose, antifoggants such as potassium bromide and compounds as described in Japanese Patent Kokai No. 47-26201, developing agents such as hydroquinones, catechol and 1-phenyl-3-pyrazolidone, and development modifiers such as polyoxyalkylene compounds and onium compounds. The development processing solution may further contain those compounds which improve ink receptivity of the surface silver layer as described in U.S. Pat. No. 3,776,728.

The surface silver layer of the lithographic printing plates of the present invention after subjected to development can be rendered ink receptive or enhanced in ink receptivity by optional known surface treating agents. Such treating agent is described, for example, in Japanese Patent Kokoku No. 48-29723 and U.S. Pat. No. 3,721,559. The printing method, etch solution or fountain solution may be those generally well known to the art.

The present invention will be explained by the following nonlimiting examples.

EXAMPLE 1

The following undercoat layer was coated on a polyethylene terephthalate film support subjected to an aqueous subbing treatment with a subbing composition containing the epoxy compound described in Japanese Patent Kokai No.60-213942 for the purpose of hydrophilization.

<Coating solution for undercoat layer>

| | |
|---|---|
| Gelatin | 15 g |
| Water | 200 g |
| Silica particles: CARPLEX manufactured by Shionogi & Co., Ltd. | x g |
| Water | 160 g |
| Carbon black dispersion (solid content 32%) | 8 g |
| Formaldehyde (30% aqueous solution) | 2 g |
| Glyoxal (30% aqueous solution) | 4 g |
| Surface active agent | 6 ml |

Water was added to make up 600 g in total.

The coating solutions for undercoat layer were prepared with varying silica particle size, amount of silica and amount of gelatin. Coating amount was 60 g/m$^2$ in moisture content. On the undercoat layer was coated an orthochromatically sensitized high-contrast silver chloride emulsion at a coating amount of 1.5 g/m$^2$ in terms of silver nitrate and at a gelatin amount of 0.8 g/m$^2$. The sample was dried and, then, heated at 50° C. for 2 days. Thereon was coated a nuclei coating solution described in Example 2 of Japanese Patent Kokai No. 58-21602 (containing the acrylamide-imidazole copolymer of No.3 as polymer and 0.8 g/m$^2$ of hydroquinone as a developing agent) to which 0.04 g/m$^2$ of sodium polyacrylate (average molecular weight 260000) was added.

The arithmetical mean deviation of the profile Ra of the resulting lithographic printing plates is as shown in Table 1.

Each of the resulting lithographic printing plates was imagewise exposed by a process camera processor CP-550II manufactured by Mitsubishi Paper Mills Ltd. and developed. The development was carried out at 30° C. for 20 seconds using the following diffusion transfer developing solution. The stabilization was carried out at 25° C. for 20 seconds using the following stabilizing solution, followed by drying.

<Diffusion transfer developing solution>

| | |
|---|---|
| Water | 700 g |
| Sodium hydroxide | 18 g |
| Potassium hydroxide | 7 g |
| Anhydrous sodium sulfite | 50 g |
| 2-Mercaptobenzoic acid | 1 g |
| Uracil | 10 g |
| 2-Methylaminoethanol | 30 g |
| 5-Phenyl-2-mercapto-1,3,4-oxadiazole | 0.1 g |
| Potassium bromide | 1 g |

Water was added to make up 1,000 ml in total.

<Stabilizing solution>

| | |
|---|---|
| Water | 600 g |
| Citric acid | 10 g |
| Sodium citrate | 35 g |
| Colloidal silica (20%) | 5 g |
| Ethylene glycol | 5 g |

Water was added to make up 1,000 ml in total.

Evaluation on printing was conducted using an offset printing machine A. B. Dick 350 CD (manufactured by A. B. Dick Co.). The stain resistance of non-image portions was evaluated in the following manner. Printing was carried out by the A. B. Dick 350 CD using F Gloss Purple 68S manufactured by Dainippon Ink & Chemicals Inc. as an ink, a 2.5% aqueous solution of KPS #500 manufactured by Losoth Co. as a fountain solution. The stain resistance was evaluated in terms of the number of prints before the printing had become impossible owing to occurrence of stain in the non-image portion and expressed in grade rated in accordance with the following criteria.

(A) More than 3000 prints
(B) 1000–3000 prints
(C) 500–1000 prints
(D) 100–500 prints
(E) Less than 100 prints The scratch resistance was evaluated by the level of scratch which occurred on the surface of the printing plate after subjected to the development by the processor.

(A) No scratch occurred on the surface of the printing plate.
(B) Very light scratches were seen on the surface.
(C) Light scratch marks were seen at printing.
(D) Clear scratch marks were seen at printing.

The print image quality was evaluated by the quality of printed images.

(A) Good
(B) Fairly good
(C) Somewhat bad
(D) Bad

The test results are shown in Table 1.

| Carbon black dispersion (solid content 32%) | 8 g |
| Formaldehyde (30% aqueous solution) | 4 g |
| Surface active agent | 6 ml |

Water was added to make up 500 g in total.

Coating amount was 50 g/m² in moisture content. On the undercoat layer was coated an orthochromatically sensitized high-contrast silver chloride emulsion at a coating amount of 1.0 g/m² in terms of silver nitrate and at a gelatin amount of 0.8 g/m². The sample was dried and, then, heated at 50° C. for 2 days. Thereon was coated a nuclei coating solution described in Example 2 of Japanese Patent Kokai No.58-21602 (containing the acrylamide-imidazole copolymer of No.3 as polymer and 0.8 g/m² of hydroquinone as a developing agent) to which 0.04 g/m² of sodium polyacrylate (average molecular weight 260000) was added. (Sample 6).

For comparison, a lithographic printing plate was made in the same manner as for Sample 6, except that a paper support laminated with polyethylene having an arithmetical mean deviation of the profile Ra of 1.1 μ was used. (Comparative

TABLE 1

| | Particle size of silica particles (μ) | Amount of silica in undercoat layer (X g) | Arithmetical mean deviation of profile (Ra) | Scratch resistance | Stain resistance | Print image quality |
| --- | --- | --- | --- | --- | --- | --- |
| Sample 1 | 1.0 | 25.0 | 0.35 | A | A | A |
| Sample 2 | 1.0 | 30.0 | 0.40 | A | A | A |
| Sample 3 | 1.0 | 40.0 | 0.55 | A | A | B |
| Sample 4 | 1.5 | 26.0 | 0.43 | A | A | A |
| Sample 5 | 2.0 | 26.0 | 0.50 | A | A | A |
| Comparative Sample a | 1.0 | 7.0 | 0.13 | D | A | A |
| Comparative Sample b | 1.0 | 55.0 | 0.78 | A | B | C |
| Comparative Sample c | 2.0 | 10.5 | 0.18 | C | A | A |
| Comparative Sample d | 3.0 | 5.5 | 0.15 | C | A | A |
| Comparative Sample e | 6.0 | 22.5 | 1.0 | A | C | D |

It can be seen from Table 1 that the samples of the present invention which contained the matting agent in an amount of 2.0 g/m² or more and had an Ra value of 0.6 or less were superior to the comparative samples in stain resistance, scratch resistance and print image quality.

EXAMPLE 2

A paper support prepared by laminating on both sides of a paper a polyethylene having an arithmetical mean deviation of the profile Ra of 0.4 μ was used. A backcoat layer containing 0.8 g/m² of gelatin and a matting agent was coated on one side of the paper support and the following undercoat layer was coated on another side of the support.

<Coating solution for undercoat layer>

| Gelatin | 20 g |
| Water | 300 g |
| Silica particles: CARPLEX FPS-101 manufactured by Shionogi & Co., Ltd. (average particle size 1.1 μm) | 25 g |

Sample f). The arithmetical mean deviation of the profile Ra of these lithographic printing plates was measured and the results are shown in Table 2.

Next, the above lithographic printing plates were subjected to imagewise exposure and development in the same manner as in Example 1. Evaluation on printing was conducted using a printing machine RISLON 40 manufactured by Komori Corporation. Each of the lithographic printing plates was treated with the following etch solution and, thereafter, printing was carried out using a 2% silver master fountain solution OD 50 manufactured by Mitsubishi Paper Mills Ltd. and TRANS-G SUMI N ink manufactured by Dainippon Ink & Chemicals Inc.

<Etch solution>

| Water | 600 g |
| Isopropyl alcohol | 400 g |
| Ethylene glycol | 50 g |
| 3-Mercapto-4-acetamido-5-n-heptyl-1,2,4-triazole | 1 g |

Then, water retention of non-image portion (stain resistance of non-image portion) was evaluated in the following manner. Printing was carried out by the RISLON 40 using F Gloss Purple 68N manufactured by Dainippon Ink & Chemicals Inc. as an ink and a 2% fountain solution OD 50 manufactured by Mitsubishi Paper Mills Ltd., and the water retention was evaluated in terms of the number of prints before the printing had become impossible owing to occurrence of stains in the non-image portion and expressed in grade rated in accordance with the criteria as in Example 1.

Furthermore, printing endurance was evaluated using the offset printing machine A. B. Dick 350 CD in the following manner. The lithographic printing plate was treated with the above etch solution and printing was carried out using the following fountain solution and NEW CHAMPION SUMI N manufactured by Dainippon Ink & Chemicals Inc. as an ink. The printing endurance was evaluated in terms of the number of prints before the printing had become impossible owing to occurrence of disappearance of images caused by wearing off of the silver images and expressed in grade rated in accordance with the following criteria.

(A) More than 20,000 prints (B) 10,000–20,000 prints (C) 5,000–10,000 prints (D) 2,000–5,000 prints (E) Less than 2,000 prints Results of printing are shown in Table 2.

<Fountain solution>

| o-Phosphoric acid | 10 g |
|---|---|
| Nickel nitrate | 5 g |
| Sodium nitrite | 5 g |
| Ethylene glycol | 100 g |
| Colloidal silica (20% solution) | 28 g |

Water was added to make up 2,000 ml in total.

TABLE 2

| | Ra of printing plate | Print image quality | Stain | Printing endurance |
|---|---|---|---|---|
| Sample 6 | 0.5μ | A | B | B |
| Comparative Sample f | 1.1μ | D | D | B |

As can be seen from Table 2, Sample 6 was superior in both the print image quality and the stain resistance while Comparative Sample f was inferior in both the print image quality and the stain resistance. Thus, the object of the present invention can be attained by the lithographic printing plates of the present invention.

EXAMPLE 3

A paper support prepared by laminating on both sides of a paper a polyethylene having an arithmetical mean deviation of the profile Ra of 0.4 μ was used. A backcoat layer containing 0.8 g/m² of gelatin and a matting agent was coated on one side of the paper support and the following undercoat layer was coated on another side of the support.

<Coating solution for undercoat layer>

| Gelatin | 25 g |
|---|---|
| Water | 300 g |
| Silica particles: SILICIA manufactured by Fuji Davidson Co., Ltd. (Grade 445, average particle size 3.5 μm) | 6 g |
| Carbon black dispersion (solid content 32%) | 8 g |
| Formaldehyde (30% aqueous solution) | 4 g |
| Surface active agent | 6 ml |

Water was added to make up 500 g in total.

Coating amount was 50 g/m² in moisture content. On the undercoat layer was coated an orthochromatically sensitized high-contrast silver chloride emulsion at a coating amount of 1.0 g/m² in terms of silver nitrate. The sample was dried and, then, heated at 50° C. for 2 days. Thereon was coated a nuclei coating solution used for lithographic printing plate C described in Example 1 of Japanese Patent Kokai No. 6-67434. (Comparative Sample g).

Next, a lithographic printing plate was prepared in the same manner as above, except that a paper support prepared by laminating on both sides of a paper a polyethylene having an arithmetical mean deviation of the profile Ra of 1.1 μ was used as a support. (Comparative Sample h).

On the other hand, a paper support was prepared by laminating on both sides of a paper a polyethylene having an arithmetical mean deviation of the profile Ra of 0.4 μ. A backcoat layer containing 0.8 g/m² of gelatin and a matting agent was coated on one side of the paper support and the following undercoat layer was coated on another side of the support.

<Coating solution for undercoat layer>

| Gelatin | 25 g |
|---|---|
| Water | 300 g |
| Silica particles: CARPLEX FP-101 manufactured by Shionogi & Co., Ltd. (average particle size 1.1 μm) | 25 g |
| Carbon black dispersion (solid content 32%) | 8 g |
| Formaldehyde (30% aqueous solution) | 4 g |
| Surface active agent | 6 ml |

Water was added to make up 500 g in total.

Coating amount was 50 g/m² in moisture content. Thereafter, in the same manner as in Example 2, a lithographic printing plate was prepared (Sample 7). Then, in the same manner as in Example 1, a printing plate was made and evaluated. The results are shown in Table 3.

TABLE 3

| | Ra of printing plate | Print image quality | Stain | Printing endurance |
|---|---|---|---|---|
| Comparative Sample g | 1.3μ | D | C | D |
| Comparative Sample h | 1.5μ | D | C | C |
| Sample 7 | 0.4μ | A | B | B |

As can be seen from Table 3, Sample 7 was superior in print image quality and others while Comparative Samples g and h were inferior in print image quality and others. Thus, the object of the present invention can be attained by the lithographic printing plate of the present invention.

EXAMPLE 4

The following undercoat layer was coated on a polyethylene terephthalate film support subjected to an aqueous subbing treatment with a subbing composition containing the epoxy compound described in Japanese Patent Kokai No. 60-213942 for the purpose of hydrophilization.

<Coating solution for undercoat layer>

| | |
|---|---|
| Gelatin | 15 g |
| Water | 120 g |
| Titanium oxide (SR-1 manufactured by Sakai Chemical Co., Ltd.) | 30 g |
| Water | 100 g |
| Silica particles: CARPLEX manufactured by Shionogi & Co., Ltd. (average particle size 1.1 μm) | 25 g |
| Carbon black dispersion (solid content 32%) | 8 g |
| Formaldehyde (30% aqueous solution) | 2 g |
| Glyoxal (40% aqueous solution) | 4 g |
| Surface active agent | 6 ml |

Water was added to make up 400 g in total.

Coating amount was 40 g/m² in moisture content. On the undercoat layer was coated an orthochromatically sensitized high-contrast silver chloride emulsion at a coating amount of 1.5 g/m² in terms of silver nitrate and at a gelatin amount of 0.8 g/m². The sample was dried and, then, heated at 50° C. for 2 days. Thereon was coated a nuclei coating solution described in Example 2 of Japanese Patent Kokai No.58-21602 (containing the acrylamide-imidazole copolymer of No. 3 as polymer and 0.8 g/m² of hydroquinone as a developing agent) to which 0.04 g/m² of sodium polyacrylate (average molecular weight 260000) was added. (Sample 8).

For comparison, a comparative sample (Comparative Sample i) was prepared in the same manner as above, except that silica having an average particle size of 10 μm (in the same amount as in Sample 8) was added to the coating solution for the undercoat layer. A comparative sample (Comparative Sample j) was prepared in the same manner as above, except that amount of gelatin in the coating solution for the undercoat layer was thrice that in Sample 8 and silica having an average particle size of 10 μm (in the same amount as in Sample 8) was added to the coating solution for the undercoat layer.

Water absorption and arithmetical mean deviation of the profile Ra of these samples were measured by the above-mentioned methods.

Then, the resulting lithographic printing plates were subjected to imagewise exposure and development in the same manner as in Example 1. A. B. Dick 350 CD was used for evaluation on printing. Printing was carried out using the same etch solution and fountain solution as used in Example 2 and NEW CHAMPION SUMI N manufactured by Dainippon Ink & Chemicals Inc. as the ink. The printing was carried out in the following manner.

1. Usual printing.
2. Supply of the fountain solution was stopped to apply the ink to the whole surface of the printing plate.
3. Supply of the fountain solution was again begun.
4. Thereafter, usual printing.

The number of prints before ink was completely removed from the non-image portion of the surface of the printing plate (referred to as "the number of ink removed prints") indicates the unremovability of ink and the degree of ink stain. The results are shown in Table 4.

The stain resistance of non-image portion was evaluated by the number of prints before printing had become impossible owing to occurrence of stain in the non-image portion and expressed in grade rated in accordance with the criteria as in Example 1.

TABLE 4

| | Water absorption on the emulsion layer-provided side (g/m²) | Arithmetical mean deviation of profile (Ra) | The number of ink removed prints | Stain resistance |
|---|---|---|---|---|
| Sample 8 | 3.5 | 0.4 | 30 | A |
| Comparative Sample i | 4.0 | 1.8 | 45 | D |
| Comparative Sample j | 8.5 | 1.0 | 200 | C |

As can be seen from Table 4, the Comparative Sample i which had a water absorption of less than 5.0 g/m², but had an arithmetical mean deviation of the profile Ra of more than 0.6 was inferior in stain resistance although the number of ink removed prints was small. Since Comparative Sample j had a water absorption of more than 5.0 g/m² and an arithmetical mean deviation of the profile Ra of more than 0.6, it was inferior in ink removability and stain resistance. Sample 8 having a water absorption of less than 5.0 g/m² and an arithmetical mean deviation of the profile Ra of 0.6 or less was superior in both the ink removability and the stain resistance.

EXAMPLE 5

Samples were prepared in the same manner as in Example 4 with varying amounts of gelatin and hardener in the coating solution for undercoat layer, and the particle size of silica as shown in Table 5. The samples were evaluated in the same manner as above. The results are shown in Table 5.

TABLE 5

| | Amount of gelatin (g) | Amount of formalin (g) | Particle size of silica (μm) | Water absorption g/m² | Arithmetical mean deviation of profile (Ra) | The number of ink removed prints | Stain resistance |
|---|---|---|---|---|---|---|---|
| Sample 9 | 15 | 1.5 | 1.5 | 4.5 | 0.5 | 50 | A |
| Comparative Sample k | 15 | 3.0 | 8.0 | 3.0 | 2.0 | 30 | C |
| Comparative Sample l | 45 | 9.0 | 12 | 6.0 | 0.9 | 110 | C |

As can be seen from Table 5, Sample 9 of the present invention having a water absorption of 5.0 g/m² or less and an arithmetical mean deviation of the profile Ra of 0.6 or less was superior in both the ink removability and the stain resistance while Comparative Sample 1 having a water absorption of more than 5.0 g/m² was inferior in ink removability and Comparative Sample k having an arithmetical mean deviation of the profile Ra of more than 0.6 was inferior in stain resistance.

What is claimed is:

1. A lithographic printing plate which comprises a support and, coated thereon in succession, at least one undercoat layer, a silver halide emulsion layer and a physical development nuclei layer wherein the lithographic printing plate has an arithmetical mean deviation of the profile Ra of 0.6 or less and the layers on the silver halide emulsion layer-provided side of the support contain 2.0 g/m² or more of a matting agent having an average particle size of 0.3–2 μm.

2. A lithographic printing plate according to claim 1, wherein total amount of binder in the layers on the silver halide emulsion layer-provided side of the support is 8.0 g/m² or less.

3. A lithographic printing plate according to claim 1, wherein amount of the matting agent is 2.0–5.0 g/m².

4. A lithographic printing plate according to claim 1, wherein the undercoat layer contains 2.0 g/m² or more of the matting agent.

5. A lithographic printing plate according to claim 4, wherein a weight ratio of the matting agent to gelatin in the undercoat layer is 0.8 or higher.

6. A lithographic printing plate according to claim 1, wherein the matting agent is silica particles having an oil absorption of 150 or less measured in accordance with JIS K5101 test method.

7. A lithographic printing plate according to claim 1, wherein the support is a polyester film.

8. A lithographic printing plate according to claim 1, wherein the support is a paper support comprising a polyolefin-laminated paper.

9. A lithographic printing plate according to claim 8, wherein the polyolefin-laminated paper support has an arithmetical mean deviation of the profile Ra of 0.5 or less.

10. A lithographic printing plate according to claim 1, wherein water absorption of the layers on the silver halide emulsion layer-provided side of the support is 5 g/m² or less.

11. A lithographic printing plate according to claim 1, wherein 90% by weight or more of particles of the matting agent having an average particle size of 0.3–2.0 μm are contained in the form of dispersion of single particles.

* * * * *